(12) United States Patent
Lee

(10) Patent No.: US 7,837,360 B2
(45) Date of Patent: Nov. 23, 2010

(54) OPTICAL MODULE

(75) Inventor: Sungkeun Lee, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 169 days.

(21) Appl. No.: 12/000,917

(22) Filed: Dec. 18, 2007

(65) Prior Publication Data

US 2008/0198594 A1 Aug. 21, 2008

(30) Foreign Application Priority Data

Dec. 19, 2006 (KR) .................... 10-2006-0129743

(51) Int. Cl.
*F21V 5/04* (2006.01)
(52) U.S. Cl. .................. 362/335; 362/311.08; 362/612
(58) Field of Classification Search ................ 362/612, 362/244, 249.02, 245, 335, 311.02, 311.06, 362/311.08, 555
See application file for complete search history.

(56) References Cited

U.S. PATENT DOCUMENTS

| | | | |
|---|---|---|---|
| 7,201,509 B2* | 4/2007 | Erber | 362/560 |
| 7,347,603 B2* | 3/2008 | Ikeda et al. | 362/555 |
| 7,422,347 B2* | 9/2008 | Miyairi et al. | 362/335 |
| 7,572,036 B2* | 8/2009 | Yoon et al. | 362/331 |
| 7,625,102 B2* | 12/2009 | Koike et al. | 362/277 |
| 7,652,300 B2* | 1/2010 | Kan | 257/98 |
| 7,674,018 B2* | 3/2010 | Holder et al. | 362/311.06 |
| 7,706,073 B2* | 4/2010 | Munro | 359/627 |
| 2005/0243577 A1 | 11/2005 | Moon | |
| 2006/0291245 A1* | 12/2006 | Shimada | 362/612 |
| 2007/0091615 A1* | 4/2007 | Hsieh et al. | 362/335 |
| 2008/0278944 A1* | 11/2008 | Yoon et al. | 362/244 |
| 2008/0279541 A1* | 11/2008 | Montgomery et al. | 396/62 |

FOREIGN PATENT DOCUMENTS

| | | |
|---|---|---|
| CN | 1693969 | 11/2005 |
| CN | 1858635 | 11/2006 |

* cited by examiner

*Primary Examiner*—Stephen F Husar
*Assistant Examiner*—Peggy A. Neils
(74) *Attorney, Agent, or Firm*—McKenna Long & Aldridge LLP

(57) ABSTRACT

An optical module includes: point light sources; and an optical lens being spaced apart from the point light sources with an air layer therebetween and asymmetrically refracting and emitting a light incident from the point light sources.

6 Claims, 15 Drawing Sheets

OPTICAL MODULE

This application claims the benefit of Korean Patent Application No. 2006-0129743 filed on Dec. 19, 2006, the entire contents of which is hereby incorporated by reference for all purposes as if fully set forth herein.

BACKGROUND OF THE INVENTION

1. Field of the Invention

The present invention relates to an optical module applicable to a backlight unit of a liquid crystal display.

2. Discussion of the Related Art

As information technology develops, the demand for display devices that connect media between users and information is increasing. Hence, the need for flat panel displays (FPDs) such as liquid crystal displays (LCDs), organic light emitting diodes (OLEDs), and plasma display panels (PDPs), is increasing. Among them, liquid crystal displays are widely used which can implement a high resolution and become bigger as well as smaller.

Liquid crystal displays display an image by using the electrooptical characteristics of liquid crystal.

For this, liquid crystal display may include a liquid crystal panel and a backlight unit. The liquid crystal panel may display an image using a light provided from the backlight unit.

The backlight unit may be disposed under the liquid crystal panel to provide light to the liquid crystal panel. Such backlight units may be classified into edge type and direct type according to the position of a light source.

The edge type backlight unit refers to a backlight unit having a light source disposed in proximity to a side face of a liquid crystal panel. In the edge type backlight unit, a light emitted from the light source may be guided by a light guide plate arranged on the back surface of the liquid crystal panel, and then provided to the liquid crystal panel.

The edge type backlight unit is commonly used for small to medium size liquid crystal displays because it is relatively advantageous in thinning.

The direct type backlight unit refers to a backlight unit having a plurality of light sources disposed on the back surface of a liquid crystal panel. In the direct type backlight unit, as described above, the light sources are disposed on the back surface of the liquid crystal panel, and thus a light emitted from the light source directly irradiates to the liquid crystal panel without any help from a light guide plate. The direct type backlight unit includes a diffusion plate disposed on the back surface of the liquid crystal panel in order to prevent the shape of the light source from being viewed through the liquid crystal panel.

The direct type backlight unit is commonly used for large-size liquid crystal displays requiring a high intensity because it can use relatively many light sources compared to the edge type backlight unit.

Conventionally, cold cathode fluorescent lamps (CCFLs) have stable illumination and brightness characteristics and emitting white light. These CCFLs have been commonly used as the light source of edge type and direct type backlight units.

However, the CCFLS make difficult to have a limitation in thinning, require a high power consumption, and have a low color reproducibility.

Thereupon, in recent years, point light sources have been used as the light source that each of edge type and direct type backlight units is provided with. Here, the point light sources may include, for example, red/green/blue light emitting diodes (LEDs). Monochromatic lights emitted from the red/green/blue light emitting diodes, respectively, match well with color filters of the liquid crystal panel, and this can enhance color reproducibility.

However, a light emitted from the point light sources have strong straightforwardness, and thus the point light sources are not used alone but along with an optical lens for refracting a light emitted from the point light sources and emitting it. In other words, the point light sources and the optical lens may be configured in one package. The optical lens will be described more concretely with reference to FIG. 1.

FIG. 1 is a perspective view schematically showing a related art optical lens.

Referring to FIG. 1, the related art optical lens 30 can symmetrically refract and emit a light incident from point light sources to be disposed thereunder. Here, the optical lens 30 symmetrically refracts and emits the light incident from the point light sources in order to ensure uniform luminance distribution depending on the angle of direction by emitting the light in every angle of direction.

For this, the optical lens 30 may include an exterior curved surface 40 that is exposed to the outside and formed in a reversed cone shape at the top part. This exterior curved surface 40 may be formed symmetrically according to the direction of viewing the exterior curved surface 40. In other words, the shape of the exterior curved shape 40 viewed on a cross section taken at a right angle through the optical lens 30 may be all the same regardless of a direction for cutting the optical lens 30 at a right angle.

FIG. 2 is a view showing a result of simulating the degree of color mixing using the optical lens as shown in FIG. 1.

If the exterior curved surface 40 of the optical lens 30 is symmetrically formed, as shown in FIG. 2, the degree of color mixing of monochromatic colors emitted from point light sources including red/green/blue light emitting diodes, may be reduced. Due to this, in the edge type backlight unit having an optical lens 30 with an exterior curved shape 40 symmetrically formed, there is a problem of non-uniform luminance at a light incident portion of a light guide plate positioned in proximity to the optical lens 30. Further, the edge type backlight unit may have a problem of low light efficiency. This is because, in the edge type backlight unit, the optical lens 30 is disposed in proximity to the light incident portion of the light guide plate, thus not requiring any light emitted from substantially every angle of direction.

Meanwhile, in the direct type backlight unit having an optical lens 30 with an exterior curved shape 40 symmetrically formed, there is a problem of having to additionally arrange a diffusion member between the optical lens 30 and a diffusion plate in order to enhance the degree of color mixing. Due to this, there may be a limitation in achieving the thinning of the direct type backlight unit. Further, in the direct type backlight unit, a light emitted from the point light sources may be laterally inclined. Accordingly, the direct type backlight unit has the problem of having to increase the haze process of the diffusion plate in order to direct the light at right angles. This may lead to the problem of low light efficiency in the direct type backlight unit.

SUMMARY OF THE INVENTION

Accordingly, the present invention is directed to an optical module that substantially obviates one or more of the problems due to limitations and disadvantages of the related art.

An advantage of the present invention is to provide an optical module, which can implement a non-uniform luminance distribution depending on the angle of direction.

Another advantage of the present invention is to provide an optical module, which can enhance the degree of color mixing by implementing a non-uniform luminance distribution depending on the angle of direction.

Yet another advantage of the present invention is to provide an optical module, which can enhance light efficiency by implementing a non-uniform luminance distribution depending on the angle of direction.

Yet another advantage of the present invention is to provide an optical module, which can achieve the thinning of a backlight unit by implementing a non-uniform luminance distribution depending on the angle of direction.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the invention, as embodied and broadly described, an optical module, includes: point light sources; and an optical lens being spaced apart from the point light sources with an air layer therebetween and asymmetrically refracting and emitting a light incident from the point light sources.

In another aspect of the present invention, an optical module, includes: point light sources; and an optical lens being formed in proximity to the point light sources and having an exterior surface different in terms of the shape viewed on a cross section taken along two axes orthogonal to each other in order to asymmetrically refract a light incident from the point light sources.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will not be made in detail to an embodiment of the present invention, example of which is illustrated in the accompanying drawings. The point light sources are disposed within the internal space of the optical lens with the air layer therebetween.

Figure 1:
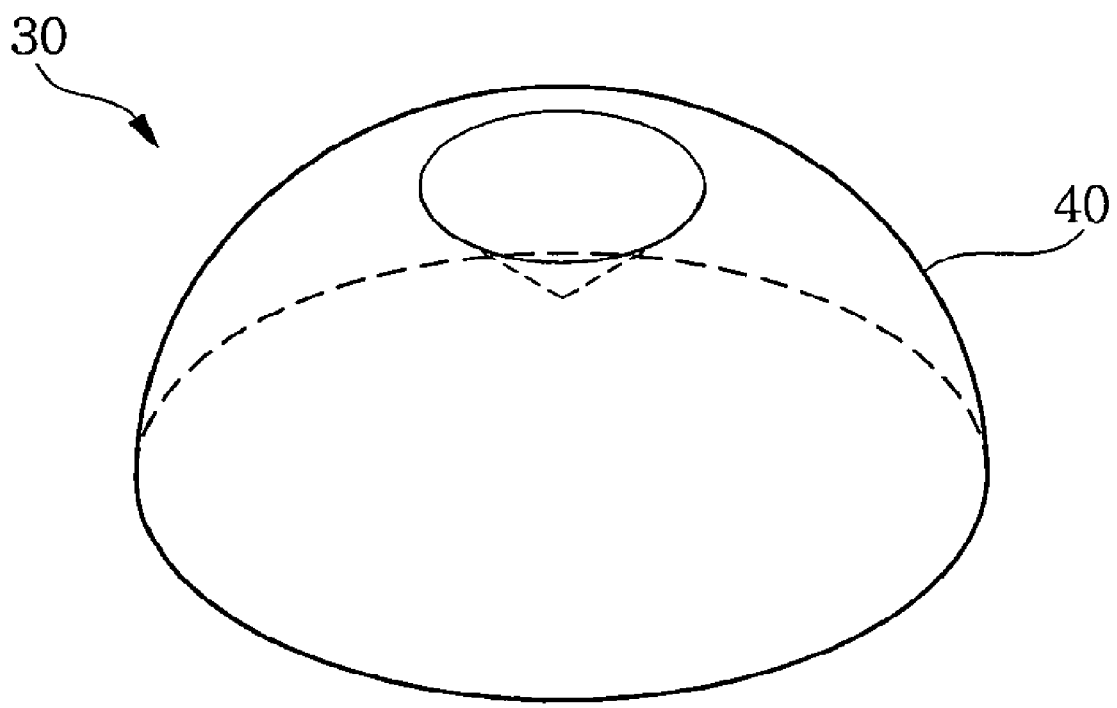
FIG. 1 is a perspective view schematically showing a related art optical lens.
Figure 2:
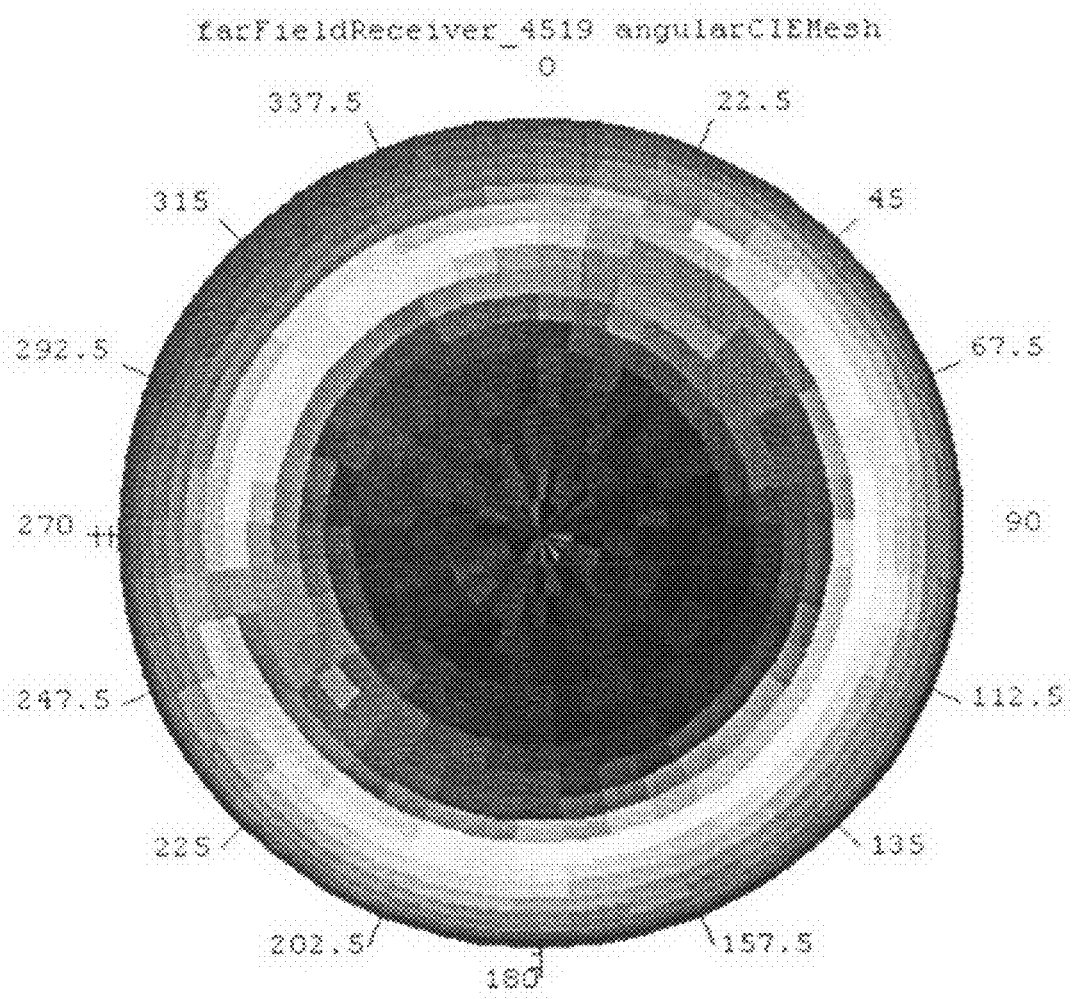
FIG. 2 is a view showing a result of simulating the degree of color mixing using the optical lens as shown in FIG. 1.
Figure 3:
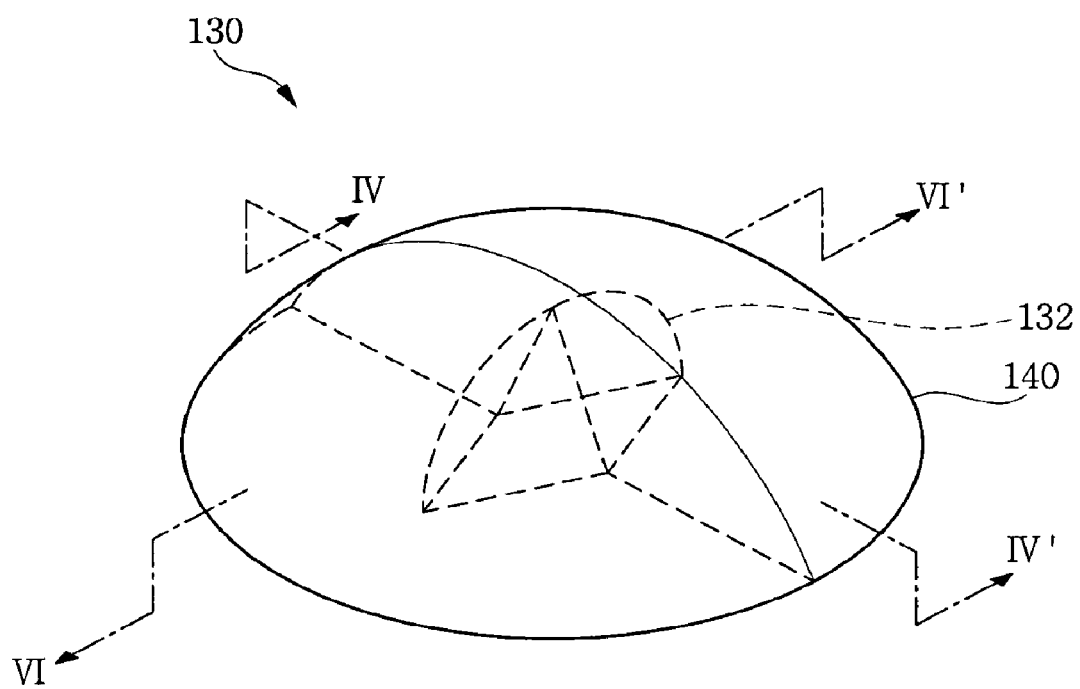
FIG. 3 is a perspective view showing an optical lens in accordance with a first embodiment of the present invention.
Figure 4:
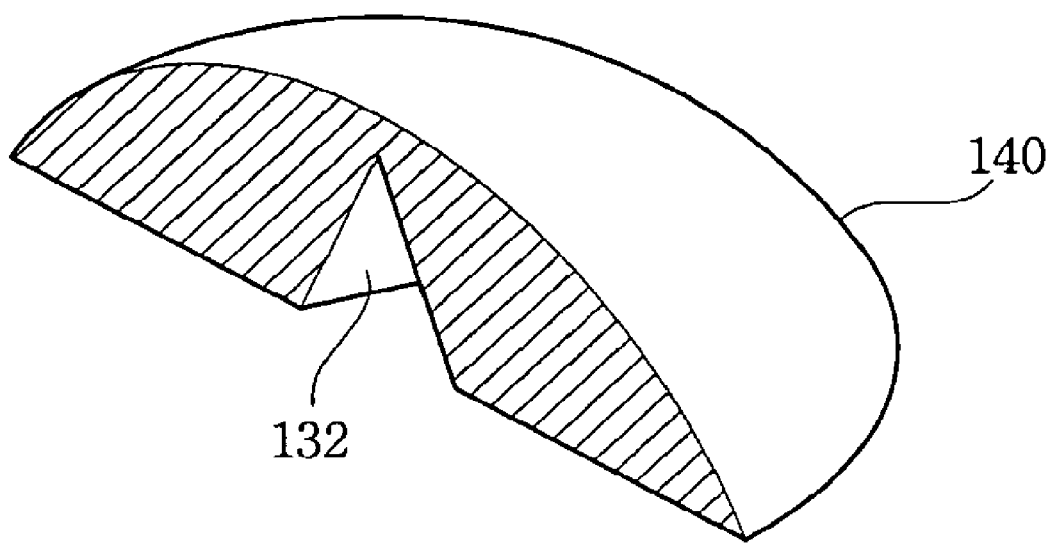
FIG. 4 is a perspective view taken along line IV-IV' of FIG. 3.
Figure 5:
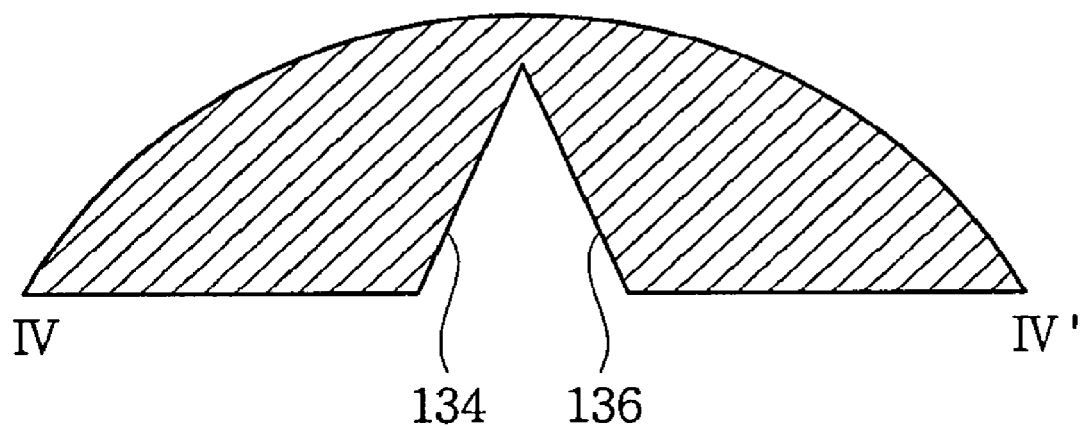
FIG. 5 is a cross sectional view taken along line IV-IV' of FIG. 3.
Figure 6:
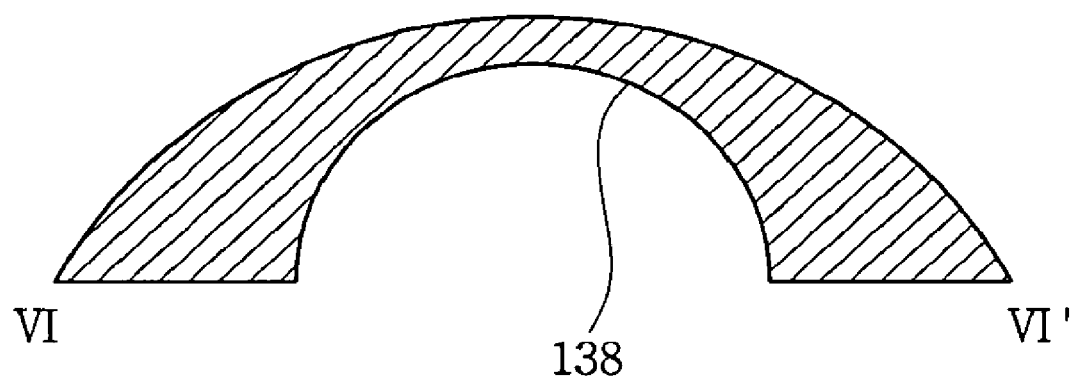
FIG. 6 is a cross sectional view taken along line VI-VI' of FIG. 3.

FIG. 3 is a perspective view showing an optical lens in accordance with a first embodiment of the present invention. FIG. 4 is a perspective view taken along line IV-IV' of FIG. 3. FIG. 5 is a cross sectional view taken along line IV-IV' of FIG. 3. FIG. 6 is a cross sectional view taken along line VI-VI' of FIG.

Referring to FIGS. 3 to 6, the optical lens 130 in accordance with the first embodiment of the present invention may be formed such that some part of the lower portion of the optical lens 130 is depressed in order to form an air layer between point light sources to be formed thereunder and the optical lens 130. The point light sources may include red/green/blue light emitting diodes in order to implement white light. The reason why an air layer is formed between the point light sources and the optical lens 130 is to ensure a distance for diffusing a light emitted from the point light sources to some extent before reaching the optical lens 130. Due to the air layer, the point light sources may be spaced apart from the optical lens 130 by a predetermined interval. The point light sources may be disposed within an internal space of the optical lens with the air layer therebetween.

The optical lens 130 can asymmetrically refract and emit the light incident from the point light sources through the air layer existing therewithin. Here, the reason why the optical lens 130 asymmetrically refracts and emits the light incident from the point light sources is to ensure a non-uniform luminance distribution depending on the angle of direction. For this, the optical lens 130 may include an interior surface 132 which is exposed to the air layer because some part of the lower portion of the optical lens 130 is depressed and an exterior surface 140 which is exposed to the outside.

The interior surface 132 can asymmetrically refract the light incident from the point light sources through the air layer existing within the optical lens 130. For this, the interior surface 132 may be different in terms of the shape viewed on a cross section taken at a right angle through the optical lens 130 along first and second directions, respectively. In other words, the interior surface 132 may be formed asymmetrically according to the direction of viewing the interior surface 132.

For example, as shown in FIG. 5, the interior surface 132 may be viewed in the shape of first and second straight lines 134 and 136 meeting at one point on a cross section taken at a right angle through the optical lens 130 along a first direction, i.e., a direction of line IV-IV'. Further, as shown in FIG. 6, the interior surface 132 may be viewed in the shape of a semicircular curve 138 on a cross section taken at a right angle through the optical lens 130 along a second direction, i.e., a direction of line VI-VI'. Here, the point light sources may be arranged in a row along the direction of line VI-VI'.

Alternatively, the interior surface 132 may be viewed in the shape of first and second straight lines 134 and 136 meeting at one point on a cross section taken at a right angle through the optical lens 130 along a first direction, and may be viewed in the shape of an elliptic curve on a cross section taken at a right angle through the optical lens 130 along a second direction. The first and second directions may be the line IV-IV' and the line VI-VI, respectively.

The exterior surface 140 can refract the light refracted by the interior surface 132 once again. For this, the exterior surface 140 may be formed in the shape of either a hemispherical surface or an ellipsoidal surface. The thickness of the optical lens 130, i.e., the distance between the interior surface 132 and the exterior surface 140, may be varied according to position due to the difference in shape between the interior surface 132 and the exterior surface 140. Due to this, there may occur a path difference to the light emitted from the point light sources and transmitted through the optical lens 130 according to position. This may lead to further diffusion of the light emitted through the optical lens 130.

At least one of the interior surface 132 and the exterior surface 140 may be hazed. This is to further diffuse the light emitted through the optical lens 130 by hazing at least one of the interior surface 132 and the exterior surface 140.

The optical lens 130 may be formed of a transparent material, such as polycarbonate (PC) and polymethylmethacrylate (PMMA), because it is necessary for the light emitted from the point light sources to transmit through the optical lens 130.

Figure 7:
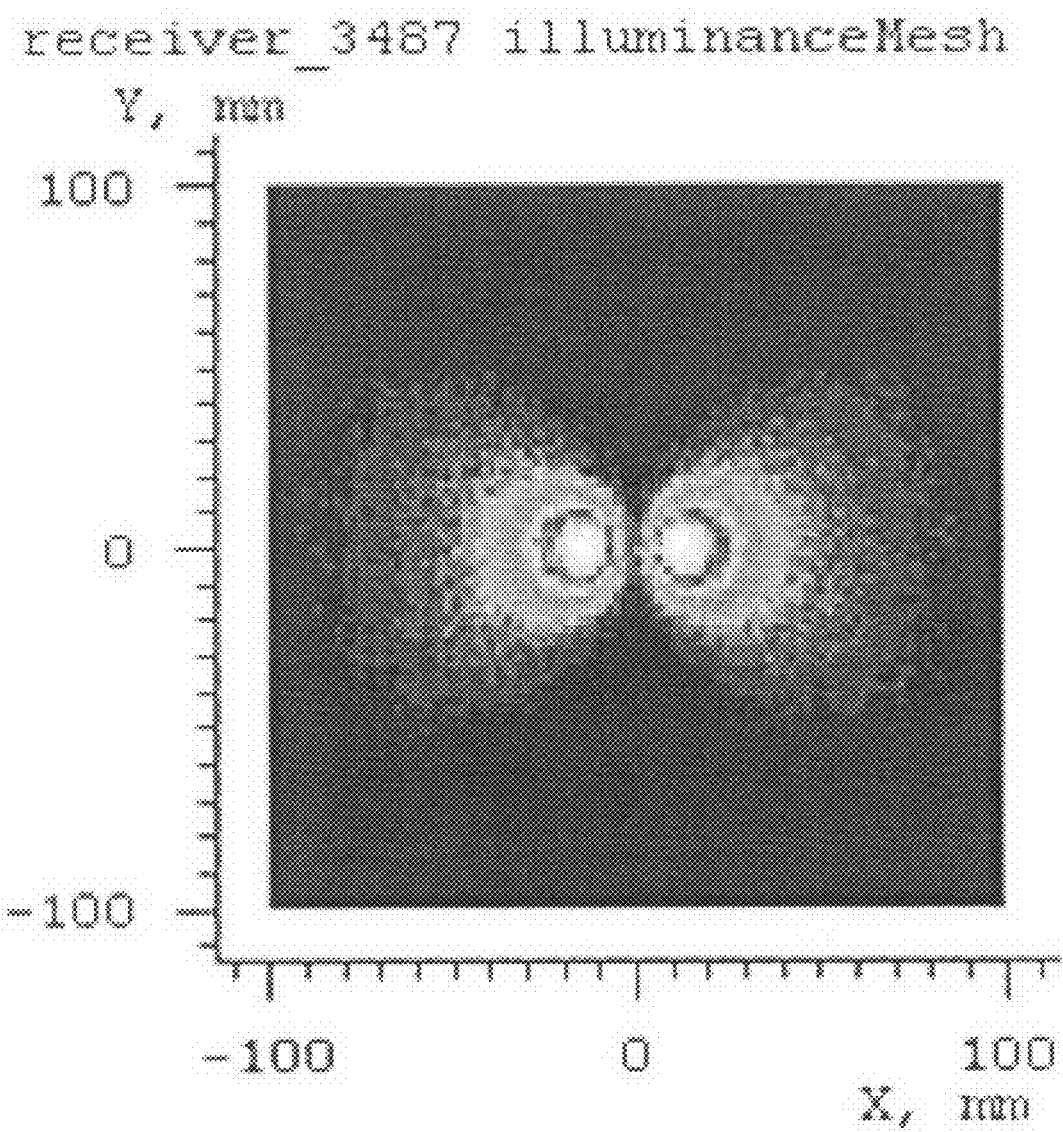
FIG. 7 is a view showing a result of simulating luminance distribution using the optical lens as shown in FIG. 3.
Figure 8:
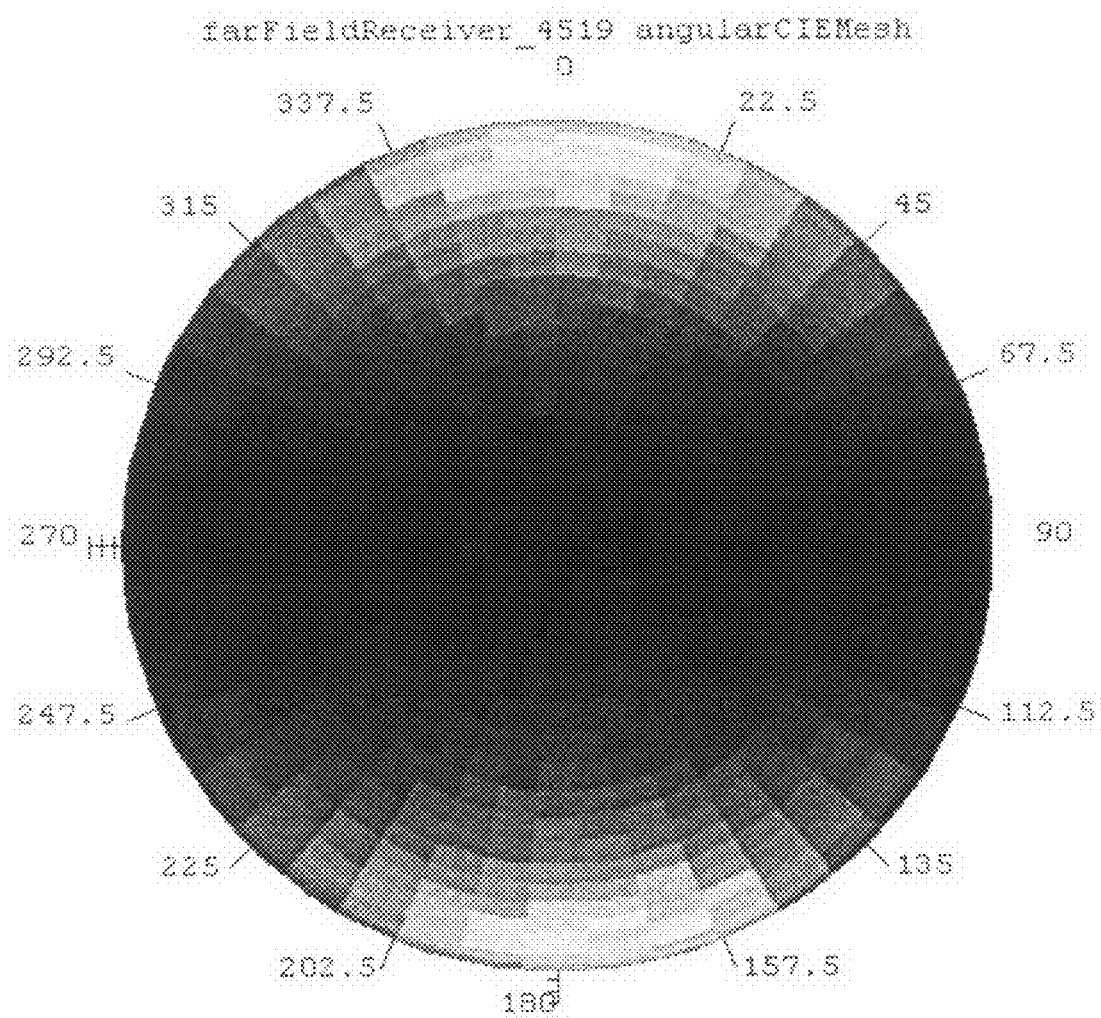
FIG. 8 is a view showing a result of simulating the degree of color mixing using the optical lens as shown in FIG. 3.

FIG. 7 is a view showing a result of simulating luminance distribution using the optical lens as shown in FIG. 3. FIG. 8 is a view showing a result of simulating the degree of color mixing using the optical lens as shown in FIG. 3.

In case of simulation using the optical lens 130, as shown in FIG. 7, a non-uniform luminance distribution may be seen depending on the angle of direction. That is, although light is emitted in a direction of approximately −40 degrees to +40 degrees from the X-axis, no light may be emitted in a direction beyond the above angle range. Here, the point light sources may be arranged in a row along the Y-axis direction.

Due to this, if red/green/blue light emitting diodes are used, all of the red/green/blue light emitting diodes can emit light within the above angle range. Therefore, as shown in FIG. 8, it is possible to enhance the degree of color mixing in a perpendicular direction. The red/green/blue light emitting diodes may be arranged in a row along a horizontal direction. Due to this, it is possible to enhance the light efficiency of the backlight unit employing the optical module 110 having the optical lens 130 and achieve the thinning of the backlight unit.

Figure 9:
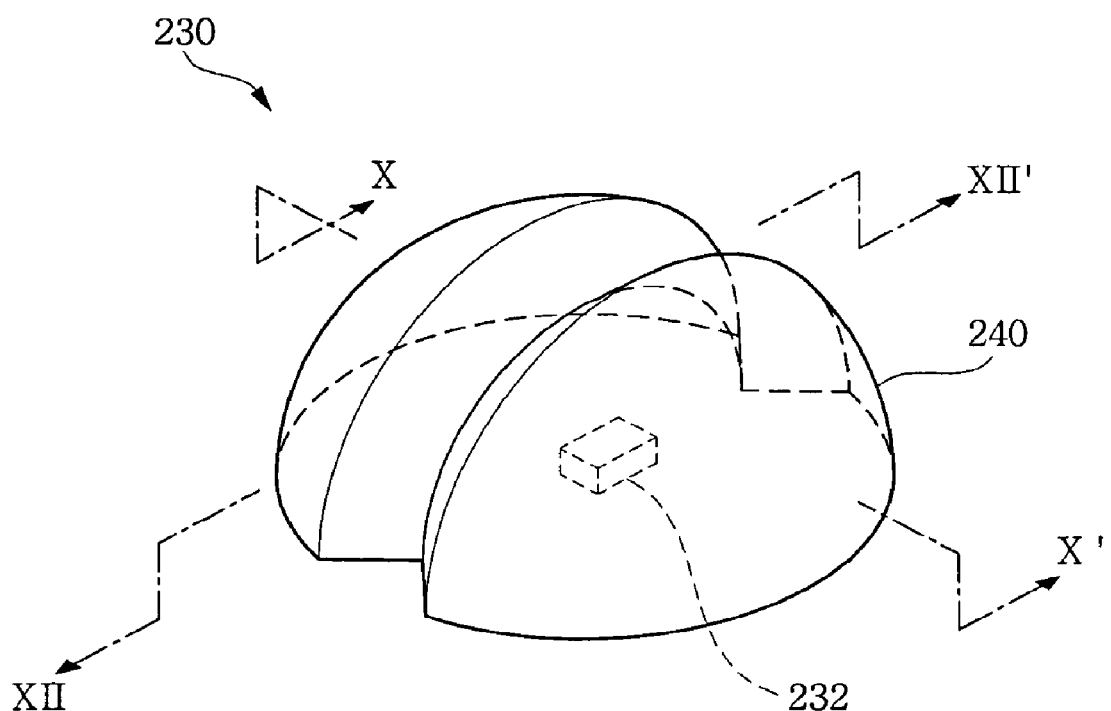
FIG. 9 is a perspective view showing an optical lens in accordance with a second embodiment of the present invention.
Figure 10:
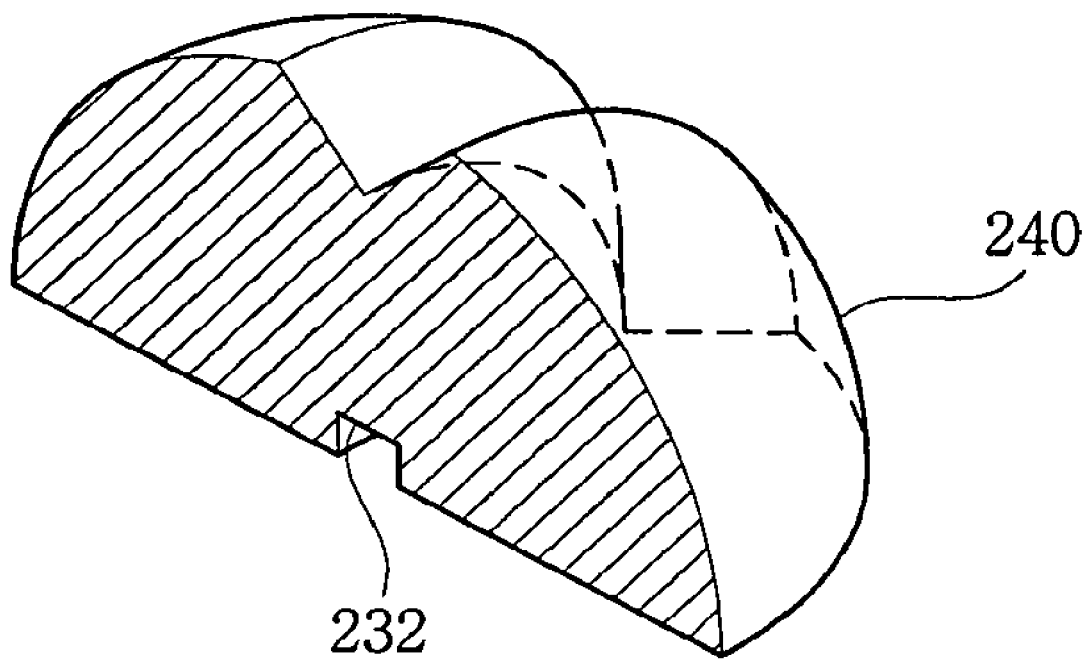
FIG. 10 is a perspective view taken along line X-X' of FIG. 9.
Figure 11:
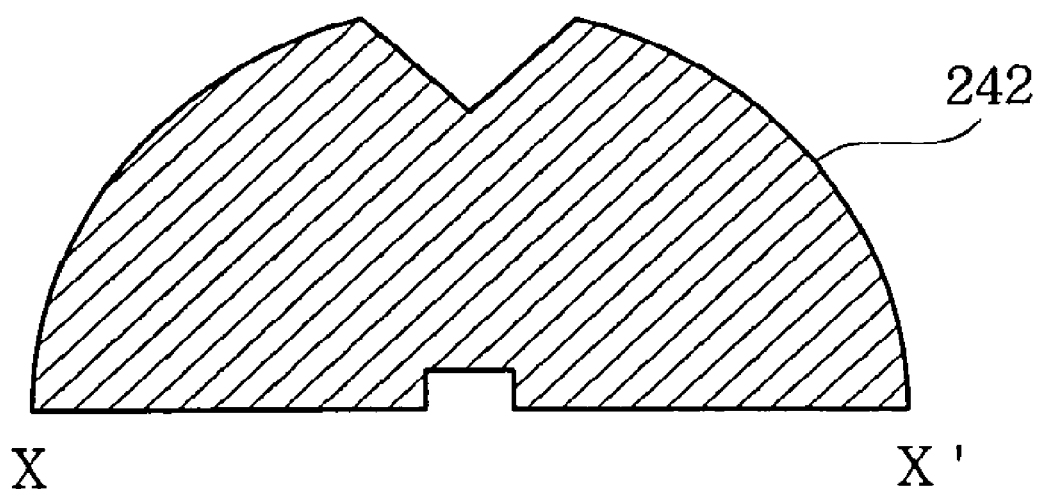
FIG. 11 is a cross sectional view taken along line X-X' of FIG. 9.
Figure 12:
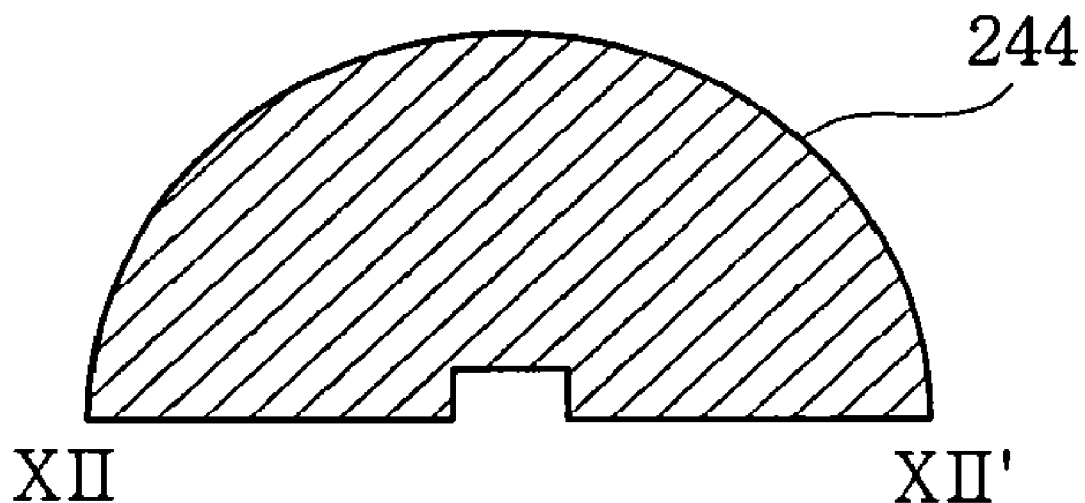
FIG. 12 is a cross sectional view taken along line XII-XII' of FIG. 9.

FIG. 9 is a perspective view showing an optical lens in accordance with a second embodiment of the present invention. FIG. 10 is a perspective view taken along line X-X' of FIG. 9. FIG. 11 is a cross sectional view taken along line X-X' of FIG. 9. FIG. 12 is a cross sectional view taken along line XII-XII' of FIG. 9. The line X-X' line and line XII-XII' of FIG. 9 may be orthogonal to each other.

Referring to FIGS. 9 to 12, the optical lens 230 in accordance with the second embodiment of the present invention can asymmetrically refract and emit a light incident from point light sources to be formed in proximity to its central lower part. The reason why the optical lens 230 asymmetrically refracts and emits the light incident from the point light sources is to ensure a non-uniform luminance distribution depending on the angle of direction. Here, the point light sources may include red/green/blue light emitting diodes in order to implement white light.

As described above, the optical lens 230 and the point light sources may be seen as if they are integrated because they are formed in proximity to each other.

The optical lens 230 may include an exterior surface 240 that is exposed to the outside in order to asymmetrically refract and emit the light incident from the point light sources.

The exterior surface 240 can asymmetrically refract the light incident from the point light sources through an interior surface 232 that is formed at the central lower part of the optical lens 230 and is in proximity to the point light sources.

For this, the exterior surface 240 may be different in terms of the shape viewed on a cross section taken at a right angle through the optical lens 230 along third and fourth directions, respectively. In other words, the exterior surface 240 may be formed asymmetrically according to the direction of viewing the exterior surface 240.

For example, as shown in FIG. 11, the exterior surface 240 may be viewed in the shape of a semicircular curve 242 depressed at the top on a cross section taken at a right angle through the optical lens 230 along a third direction, i.e., a direction of line X-X'. Further, as shown in FIG. 12, the exterior surface 240 may be viewed in the shape of a semicircular curve 244 on a cross section taken at a right angle through the optical lens 230 along a fourth direction, i.e., a direction of line XII-XII'.

Alternatively, the exterior surface 240 may be viewed in the shape of a semicircular curve 244 depressed at the top on a cross section taken at a right angle through the optical lens 230 along a third direction, and may be viewed in the shape of an elliptic curve on a cross section taken at a right angle through the optical lens 230 along a second direction. Here, the third and fourth directions may be the line X-X' and the line XII-XII', respectively.

The exterior surface 240 may be hazed. This is to further diffuse the light emitted through the optical lens 230 by hazing the exterior surface 240.

The optical lens 230 may be formed of a transparent material, such as silicon, because it is necessary for the light emitted from the point light sources to transmit through the optical lens 230.

As described above, it is possible to implement a non-uniform luminance distribution depending on the angle of direction by the exterior surface 240 having an asymmetrical shape. This may enhance the degree of color mixing and light efficiency and achieve the thinning of the backlight unit.

Figure 13:
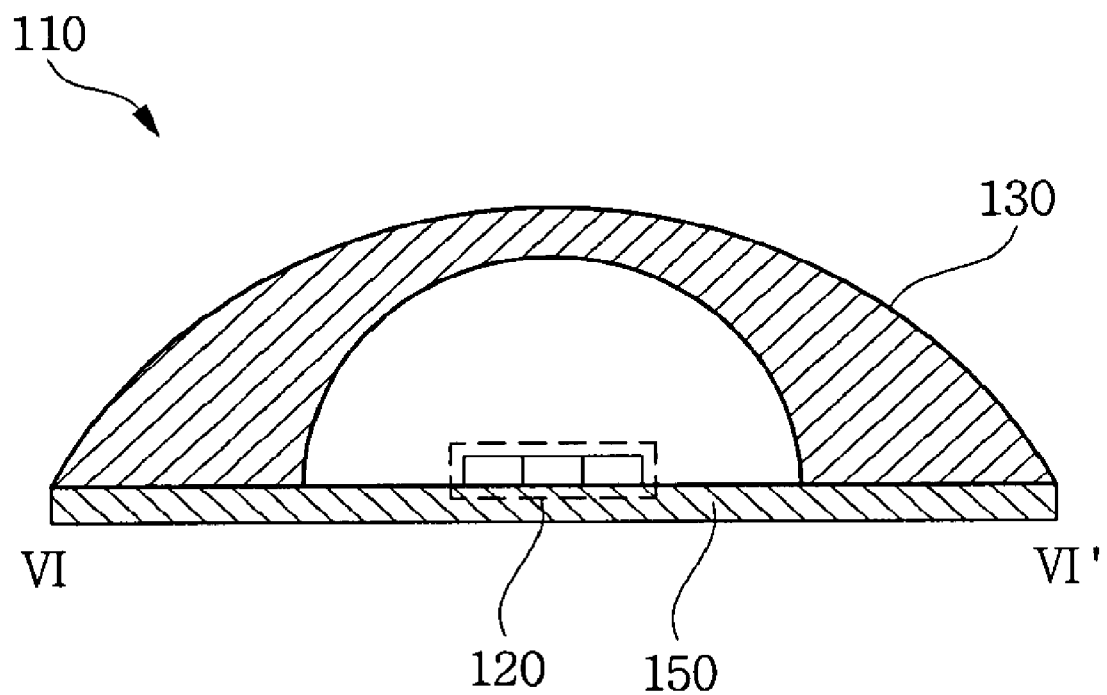
FIG. 13 is a cross sectional view schematically showing an optical module having the optical lens as shown in FIG. 3.

FIG. 13 is a cross sectional view schematically showing an optical module having the optical lens as shown in FIG. 3. As the optical lens shown in FIG. 13 is identical to that of FIG. 3, the same reference numeral as in FIG. 3 is used to denote the same element, the re-description of the structure will be omitted, and only the characteristics of the present embodiment will be described.

Referring to FIG. 13, the optical module 110 can emit an asymmetrically refracted light.

For this, the optical module 110 may include point light sources 120 and an optical lens 130 spaced apart from the point light sources 120. Also, the optical module 110 may further include a reflecting member 150. Here, the point light sources 120 may be formed under the optical lens 130.

The point light sources 120 can generate light by using a driving voltage applied from the outside, and emit the light generated therefrom to the optical lens 130. Here, the point light sources 120 may include red/green/blue light emitting diodes in order to implement white light. Here, the point light sources 120 may be mounted on a metal core printed circuit board (MCPCB). Here, the point light sources 120 may be covered by using silicon or the like capable of injection molding so as to keep the point light sources 120 from being exposed directly to an air layer existing within the optical lens 130.

The optical lens 130 may include an interior surface 132 and an exterior surface 140 that are formed to have an asymmetrical shape in order to asymmetrically refract and emit a light incident from the point light sources 120 through the air layer existing therewithin.

The reflecting member 150 can reflect the light asymmetrically refracted and emitted through the optical lens 130. Here, the reflecting member 150 may be made of, for example, an aluminum material, and may be coated on a metal core printed circuit board.

Figure 14:
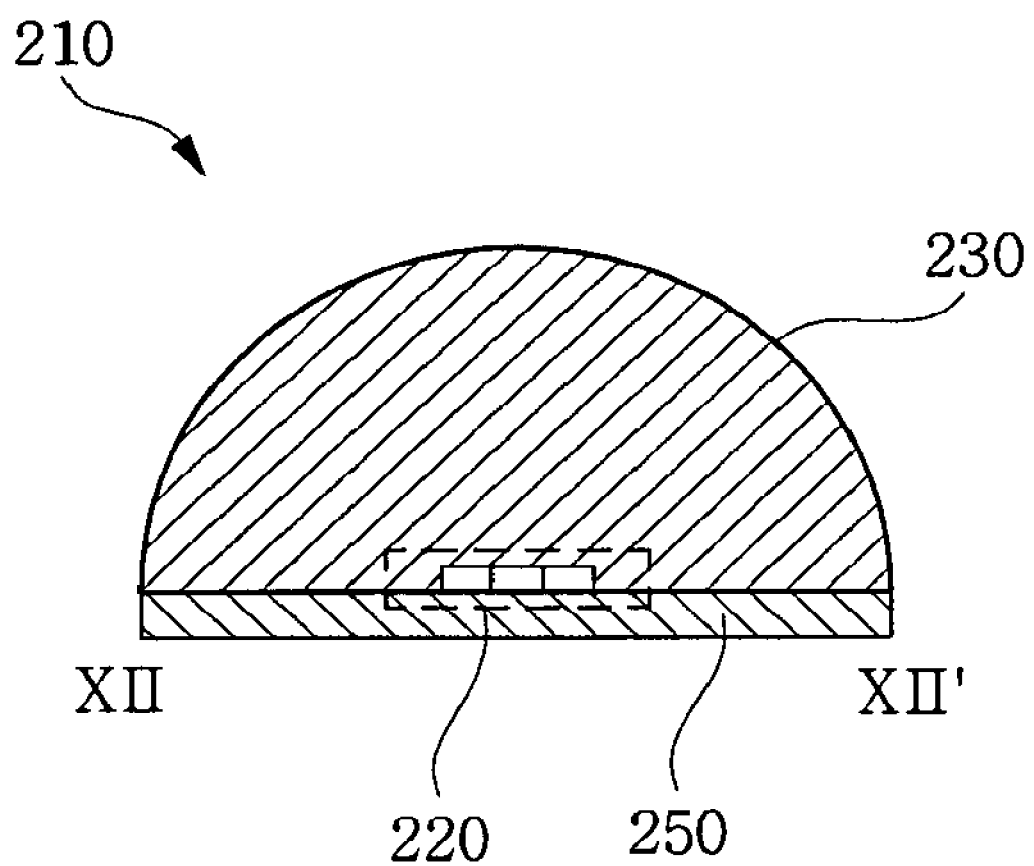
FIG. 14 is a cross sectional view schematically showing an optical module having the optical lens as shown in FIG. 9.

FIG. 14 is a cross sectional view schematically showing an optical module having the optical lens as shown in FIG. 9. As the optical lens shown in FIG. 14 is identical to that of FIG. 9, the same reference numeral as in FIG. 9 is used to denote the same element, the re-description of the structure will be omitted, and only the characteristics of the present embodiment will be described.

Referring to FIG. 14, the optical module 110 can emit an asymmetrically refracted light.

For this, the optical module 110 may include point light sources 120 and an optical lens 130 in proximity to the point light sources 120. Also, the optical module 110 may further include a reflecting member 150.

The point light sources 120 can generate light by using a driving voltage applied from the outside, and emit the light generated therefrom to the optical lens 130. Here, the point light sources 120 may include red/green/blue light emitting diodes in order to implement white light. Here, the point light sources 120 may be mounted on a metal core printed circuit board (MCPCB). Here, in case of using silicon as the material of the optical lens 230, the point light sources 220 are prepared in advance, and then formed through injection molding of the silicon so that the optical lens 230 and the point light sources are in proximity to each other.

The optical lens 230 may include an exterior surface 240 that is exposed to the outside in order to asymmetrically refract and emit the light incident form the point light sources 220.

The reflecting member 250 can reflect the light asymmetrically refracted and emitted through the optical lens 230. Here, the reflecting member 250 may be made of, for example, an aluminum material, and may be coated on a metal core printed circuit board.

Figure 15:
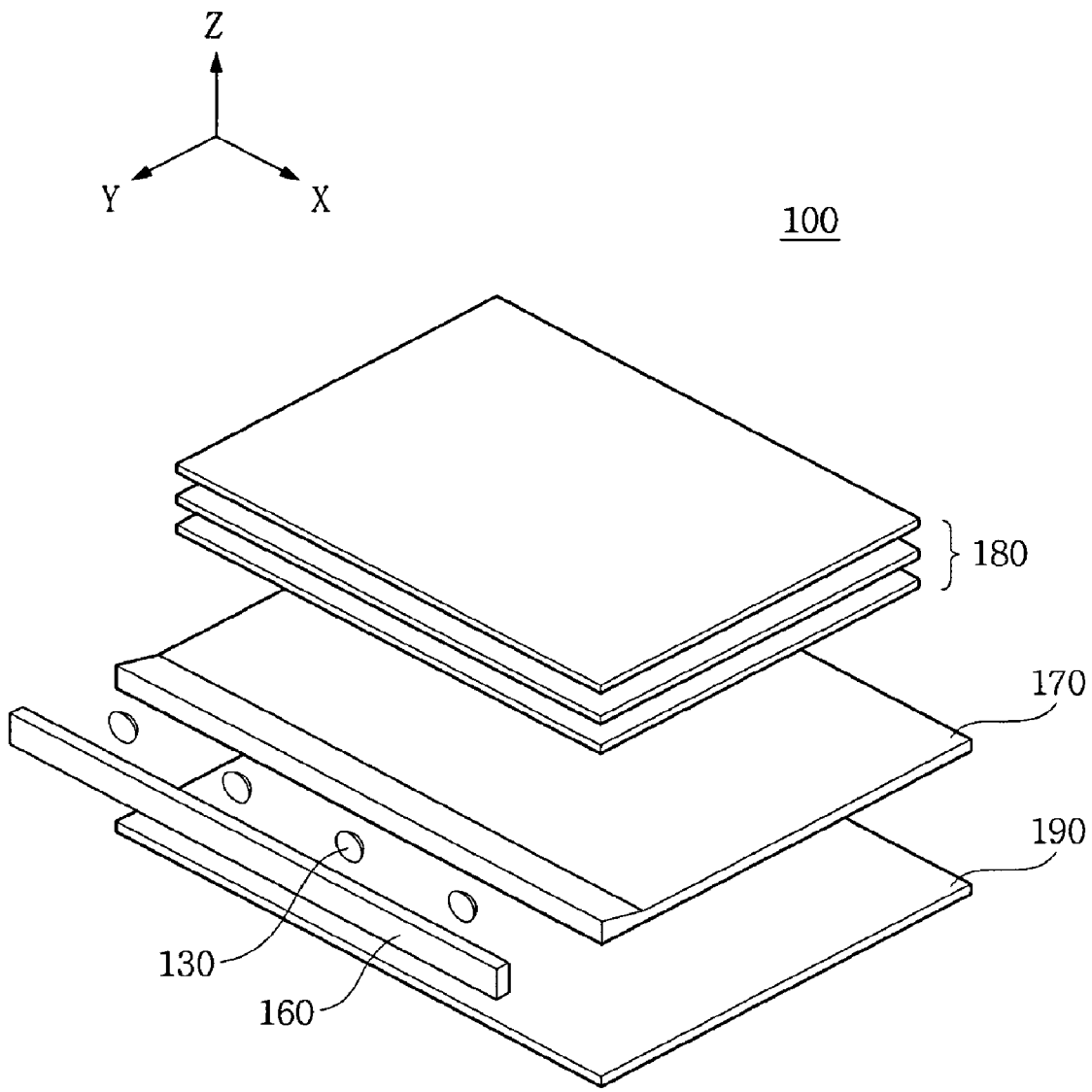
FIG. 15 is an exploded perspective view schematically showing a backlight unit having the optical module as shown in FIG. 13.

FIG. 15 is an exploded perspective view schematically showing a backlight unit having the optical module as shown in FIG. 13. As the optical lens shown in FIG. 15 is identical to that of FIG. 13, the same reference numeral as in FIG. 9 is used to denote the same element, the re-description of the structure will be omitted, and only the characteristics of the present embodiment will be described. The backlight unit having the optical module as shown in FIG. 14 is similar to the backlight unit as shown in FIG. 15, and thus the detailed description thereof will be omitted. In FIG. 15, an edge type backlight unit has been illustrated as being the backlight unit. This is only for purposes of illustration of the backlight unit in accordance with the embodiments of the present invention and not meant to be limiting.

Referring to FIG. 15, the backlight unit 100 can provide light to a liquid crystal panel to be disposed thereabove.

The backlight unit 100 may include an optical module 110, a light guide plate 170, and an optical sheet 180. the backlight unit may further include a reflecting plate 190. If the backlight unit 100 is a direct type, the light guide plate 170 may not be provided.

The optical module 110 may include point light sources 120 and an optical lens 130 spaced apart from the point light sources 120 and emitting an asymmetrical light. The optical module 110 may further include a reflection plate 190. An exterior surface 140 of the optical lens 130 may be formed to face the light guide plate 170. The optical module 110 may be disposed along a longitudinal direction of one side of the light guide plate 170. The point light sources 120 may be arranged in a row along the Z-axis direction. Unexplained reference numeral 160 denotes a metal core printed circuit board 160 for mounting the point light sources 120 thereon.

The light guide plate 170 is disposed in proximity to the optical module 110, and can guide a light incident from the optical module 110 to emit the light upward.

The optical sheet 180 is disposed over the light guide plate 170, and can diffuse and gather the light emitted upward through the light guide plate 170, i.e., the light emitted from the optical module 110, to thus upwardly emit it. The optical sheet 180 may have at least one of a diffusion sheet, a prism sheet, and a luminance enhancement sheet.

The reflection plate 190 may be disposed under the light guide plate 170, and can upwardly reflect a light emitted downward through the light guide plate 170 among the lights emitted from the optical module. The reflection plate 190 may be made of a foamed plastic, for example, a foamed polyethylene terephthalate (PET).

In accordance with the embodiments of present invention, a non-uniform luminance distribution can be implemented through an optical lens having an asymmetrical shape. Accordingly, it is possible to enhance the degree of color mixing and light efficiency and achieve the thinning of a backlight unit.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An optical module, comprising:
point light sources; and
an optical lens being spaced apart from the point light sources with an air layer therebetween so that the optical lens encloses the point light sources, and asymmetrically refracting and emitting a light incident from the point light sources,
wherein the optical lens is in contact with the air layer, includes an interior surface, and an exterior surface which is exposed to the outside, and refracts a light transmitted through the interior surface and transmits the same to the outside,
wherein the interior surface is different in the shape viewed on a cross section taken at a right angle along the optical lens along first and second directions, respectively, to thus asymmetrically refract a light proceeding in the first and second directions, and
wherein the interior surface is viewed in the shape of first and second straight lines meeting at one point on a cross section taken at a right angle through the optical lens along the first direction, while the interior surface is viewed in the shape of a semicircular curve on a cross section taken at a right angle through the optical lens along the second direction.

2. The optical module of claim 1, wherein the point light sources include at least one of red, green, and blue light emitting diodes (LEDs).

3. An optical module comprising:

point light sources; and an optical lens being spaced apart from the point light sources with an air layer therebetween so that the optical lens encloses the point light sources, and asymmetrically refracting and emitting a light incident from the point light sources, wherein the optical lens is in contact with the air layer, includes an interior surface, and an exterior surface which is exposed to the outside, and refracts a light transmitted through the interior surface and transmits the same to the outside, wherein the interior surface is different in the shape viewed on a cross section taken at a right angle along the optical lens along first and second directions, respectively, to thus asymmetrically refract a light proceeding in the first and second directions, and wherein the interior surface is viewed in the shape of first and second straight lines meeting at one point on a cross section taken at a right angle through the optical lens along the first direction, while the interior surface is viewed in the shape of an elliptic curve on a cross section taken at a right angle through the optical lens along the second direction.

4. The optical module of claim 1, wherein the exterior surface is formed in the shape of either a hemispherical surface or an ellipsoidal surface.

5. The optical module of claim 1, wherein at least one of the interior surface and the exterior surface is hazed.

6. The optical module of claim 1, wherein the point light sources and the optical lens are applied as light sources of a backlight unit for a display device.

* * * * *